United States Patent
Gu

(10) Patent No.: US 7,615,502 B2
(45) Date of Patent: Nov. 10, 2009

(54) LASER ANNEAL OF VERTICALLY ORIENTED SEMICONDUCTOR STRUCTURES WHILE MAINTAINING A DOPANT PROFILE

(75) Inventor: Shuo Gu, San Antonio, TX (US)

(73) Assignee: Sandisk 3D LLC, Milpitas, CA (US)

( * ) Notice: Subject to any disclaimer, the term of this patent is extended or adjusted under 35 U.S.C. 154(b) by 121 days.

(21) Appl. No.: 11/303,229

(22) Filed: Dec. 16, 2005

(65) Prior Publication Data

US 2007/0141858 A1 Jun. 21, 2007

(51) Int. Cl.
*H01L 21/00* (2006.01)
(52) U.S. Cl. .................. 438/795; 438/166; 438/237; 438/328; 438/486; 438/487; 438/799; 257/E21.134
(58) Field of Classification Search .............. 438/166, 438/197, 237, 308, 486, 795; 257/E21.028, 257/E21.134; 117/4
See application file for complete search history.

(56) References Cited

U.S. PATENT DOCUMENTS

| | | | |
|---|---|---|---|
| 5,766,989 A * | 6/1998 | Maegawa et al. | 438/166 |
| 6,180,444 B1 * | 1/2001 | Gates et al. | 438/237 |
| 6,316,338 B1 * | 11/2001 | Jung | 438/487 |
| 6,351,023 B1 * | 2/2002 | Gates et al. | 257/623 |
| 6,369,431 B1 | 4/2002 | Gonzalez et al. | |
| 6,521,492 B2 * | 2/2003 | Miyasaka et al. | 438/166 |
| 6,982,212 B2 * | 1/2006 | Stolk | 438/482 |
| 2003/0045074 A1 * | 3/2003 | Seibel et al. | 438/486 |
| 2003/0049894 A1 | 3/2003 | Berger et al. | |
| 2003/0124802 A1 | 7/2003 | Johnson et al. | |
| 2003/0218199 A1 * | 11/2003 | Forbes et al. | 257/302 |
| 2004/0175874 A1 * | 9/2004 | Matsumoto et al. | 438/166 |
| 2004/0206996 A1 | 10/2004 | Lee et al. | |
| 2005/0019996 A1 * | 1/2005 | Tsao | 438/166 |
| 2005/0098800 A1 | 5/2005 | Herner et al. | |
| 2005/0226067 A1 * | 10/2005 | Herner et al. | 365/201 |
| 2006/0006495 A1 | 1/2006 | Herner et al. | |
| 2006/0189052 A1 * | 8/2006 | Kim | 438/166 |
| 2008/0108206 A1 * | 5/2008 | Shimomura et al. | 438/481 |

OTHER PUBLICATIONS

International Search Report of International Application No. PCT/US2006/048242 mailed Jul. 12, 2007.

Written Opinion of International Application No. PCT/US2006/048242 mailed Jun. 16, 2008.

Nebel et al. "Pulsed-Laser Crystallized Highly Conductive Boron-Doped Microcrystalline Silicon," Materials Research Society Symposium Proceedings, 1997, pp. 331-336, vol. 467, Materials Research Society.

(Continued)

*Primary Examiner*—Sue Purvis
*Assistant Examiner*—Eric Ward
(74) *Attorney, Agent, or Firm*—Dugan & Dugan, PC

(57) ABSTRACT

A method to laser anneal a silicon stack (or a silicon-rich alloy) including a heavily doped region buried beneath an undoped or lightly doped region is disclosed. By F selecting laser energy at a wavelength that tends to be transmitted by crystalline silicon and absorbed by amorphous silicon, crystallization progresses through the silicon layers in a manner that minimizes or prevents diffusion of dopants upward from the doped region to the undoped or lightly doped region. In preferred embodiments, the laser energy is pulsed, and a thermally conductive structure beneath the heavily doped layer dissipates heat, helping to control the anneal and limit dopant diffusion.

20 Claims, 4 Drawing Sheets

OTHER PUBLICATIONS

Delli Veneri et al. "Application of Nd:YLF laser to amorphous silicon crystallization process," Materials Science and Engineering B, 2000, pp. 227-231, vol. 69-70, Elsevier Science S.A.

Wohllebe et al. "Crystallization of amorphous Si films for thin film solar cells," Journal of Non-Crystalline Solids, 1998, pp. 925-929, vol. 227-230, Elsevier Science B.V.

Nerding et al. "Grain populations in laser-crystallised silicon thin films on glass substrates," Thin Solid Films, 2001, pp. 110-112, vol. 383, Elsevier Science B.V.

Takamura et al., Physical Processes Associated with the Deactivation of Dopants in Laserannealed Silicon, Journal of Applied Physics, vol. 92, p. 235-244, 2002.

Thompson et al., Epitaxial Si-based tunnel diodes, Thin Solid Films 380 (2000), pp. 145-150.

Owen, AE., et al. , "Memory Switching in Amorphous Silicon Devices", Journal of Non-Crystalline Solids, 59 &60, (1983), 1273-1280, North Holland Publishing Company.

Tsuno, M., et al., "Suppression of reverse-short-channel effect in sub-0.1 μm n-MOSFETs with Sb S/D implantation", Electronics Letters, Mar. 18, 1999, vol. 35., No. 6, pp. 508-509.

Alzanki et al., "Concentration Profiles of Antimony-Doped Shallow Layers in Silicon", Semiconductor Science and Technology, IPO, Bristol, GB, vol. 19, No. 6, Jun. 1, 2004, pp. 728-732.

OA dated Mar. 14, 2008 (U.S. Appl. No. 11/271,078).

OA dated May 16, 2007 (U.S. Appl. No. 11/271,078).

FOA dated Jan. 14, 2009 (U.S. Appl. No. 11/271,078).

PCT (PCT/US06/043482) IPRP dated May 22, 2008.

PCT (PCT/US06/043482) ISR and WO dated May 23, 2007.

PCT-EPC (06837153.3) OA dated Jan. 19, 2009.

Shibahara, K, et al., "Low Resistive Ultra Shallow Junction for Sub 0.1 μm MOSFETs Formed by Sb implantation", Electron Devices Meeting, 1996, International Dec. 8-11, 1996, pp. 579-582.

\* cited by examiner

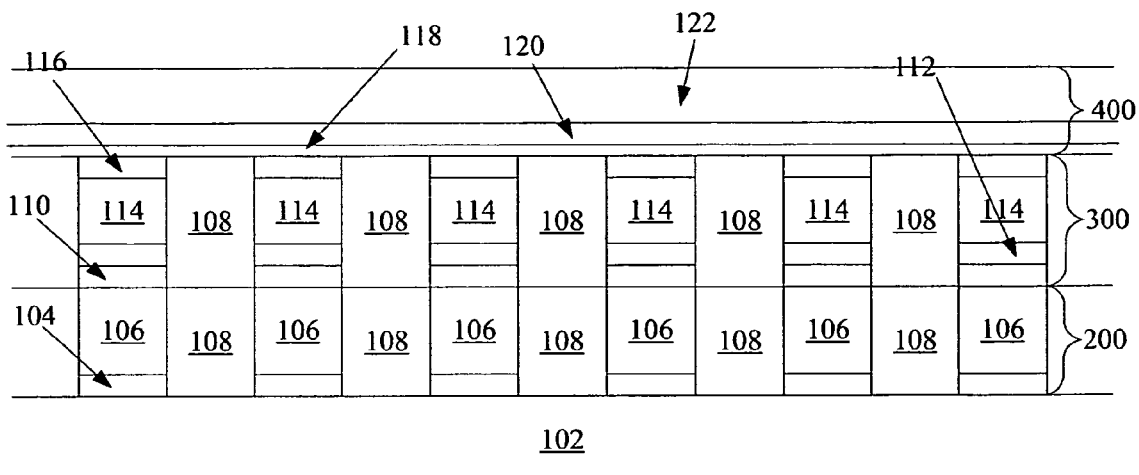
Fig. 5c
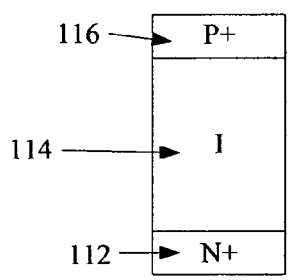 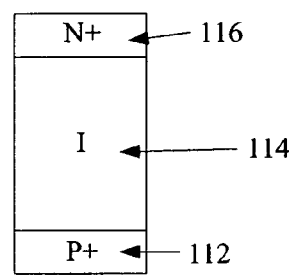
Fig. 6a  Fig. 6b

LASER ANNEAL OF VERTICALLY ORIENTED SEMICONDUCTOR STRUCTURES WHILE MAINTAINING A DOPANT PROFILE

BACKGROUND OF THE INVENTION

The invention relates to laser annealing of deposited layers of silicon or silicon alloys.

Deposited silicon, used in many semiconductor devices, is generally amorphous, microcrystalline, or polycrystalline. Ground boundaries between adjacent silicon grains impede current flow. If the deposited silicon is to be used in a device in which speed or current density is to be maximized, it may be advantageous to lessen the number of grain boundaries by increasing grain size.

A known method to increase grain size is laser annealing of silicon, which has been used in formation of transistors to increase grain size in the silicon channel region. In devices in which a heavily doped silicon layer is buried beneath an undoped or lightly doped silicon layer, and that dopant profile is critical to device performance, however, laser annealing has not been used. Laser annealing locally melts and recrystallizes silicon. During conventional laser annealing, dopants will diffuse from the heavily doped layer to the undoped or lightly doped layer, and the desired dopant profile will be lost.

There is a need, therefore, for a method to laser anneal a deposited silicon layer (or a layer of a silicon-rich alloy) having a dopant profile while maintaining that dopant profile undisturbed.

SUMMARY OF THE PREFERRED EMBODIMENTS

The present invention is defined by the following claims, and nothing in this section should be taken as a limitation on those claims. In general, the invention is directed to laser annealing of silicon or silicon alloys.

A first aspect of the invention provides for a method for laser annealing to crystallize a semiconductor layer, the method comprising: depositing a polycrystalline, microcrystalline, or amorphous semiconductor layer having a lower heavily doped region and an adjacent upper undoped or lightly doped region; and after depositing the upper undoped or lightly doped region, crystallizing the lower heavily doped region and the upper undoped or lightly doped region by illuminating the semiconductor layer with laser energy, wherein before the crystallizing step, the lower heavily doped region has a first thickness in which dopant concentration is at least $1 \times 10^{19}$ dopant atoms/cm$^3$ and after the crystallizing step, the lower heavily doped region has a second thickness in which dopant concentration is at least $1 \times 10^{19}$ dopant atoms/cm$^3$, wherein the second thickness is no more than 300 angstroms more than the first thickness.

Another aspect of the invention provides for a method for forming a memory cell, the method comprising: forming a bottom conductor; depositing an amorphous, microcrystalline, or polycrystalline semiconductor layer above the bottom conductor, the semiconductor layer comprising a bottom heavily doped region and a middle lightly doped or undoped region; crystallizing the semiconductor layer by illuminating the semiconductor layer with laser energy; and forming a top conductor above the semiconductor layer, wherein the memory cell comprises a portion of the bottom conductor, the semiconductor layer, and a portion of the top conductor, wherein the semiconductor layer further comprises a top heavily doped region, and wherein, after formation of the memory cell is complete, the semiconductor layer has a thickness no more than about 3500 angstroms and the middle lightly doped or undoped region has a thickness no less than about 1000 angstroms.

A preferred embodiment of the invention provides for a method for forming a first memory level, the method comprising: forming a first plurality of substantially parallel, substantially coplanar conductors; forming a first heavily doped polycrystalline semiconductor layer above the first conductors; forming a second lightly doped or undoped polycrystalline semiconductor layer on the first heavily doped polycrystalline semiconductor layer; laser annealing the first and second semiconductor layers; patterning and etching the first and second semiconductor layers to form first pillars; forming a top heavily doped region in each first pillar wherein each pillar comprises a vertically oriented p-i-n diode; and forming a second plurality of substantially parallel, substantially coplanar conductors above the first pillars, wherein, after formation of the first memory level, each vertically oriented p-i-n diode comprises a lightly doped or undoped region having a thickness of at least 1000 angstroms.

Another preferred embodiment provides for a monolithic three dimensional memory array comprising: a) a first memory level formed by a method comprising: i) forming a first plurality of substantially parallel, substantially coplanar conductors; ii) forming a first heavily doped polycrystalline semiconductor layer above the first conductors; iii) forming a second lightly doped or undoped polycrystalline semiconductor layer on the first heavily doped polycrystalline semiconductor layer; iv) laser annealing the first and second semiconductor layers; v) patterning and etching the first and second semiconductor layers to form first pillars; vi) forming a top heavily doped region in each first pillar by ion implantation wherein each pillar comprises a vertically oriented p-i-n diode; and vii) forming a second plurality of substantially parallel, substantially coplanar conductors above the first pillars, and b) a second memory level monolithically formed above the first memory level.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 5a-5c are cross-sectional views showing stages of fabrication of a first memory level of a monolithic three dimensional memory array formed according to a preferred embodiment of the present invention.

FIGS. 6a and 6b are cross-sectional views of vertical diodes formed according to embodiments of the present invention.

DETAILED DESCRIPTION OF THE PREFERRED EMBODIMENTS

Figure 1:
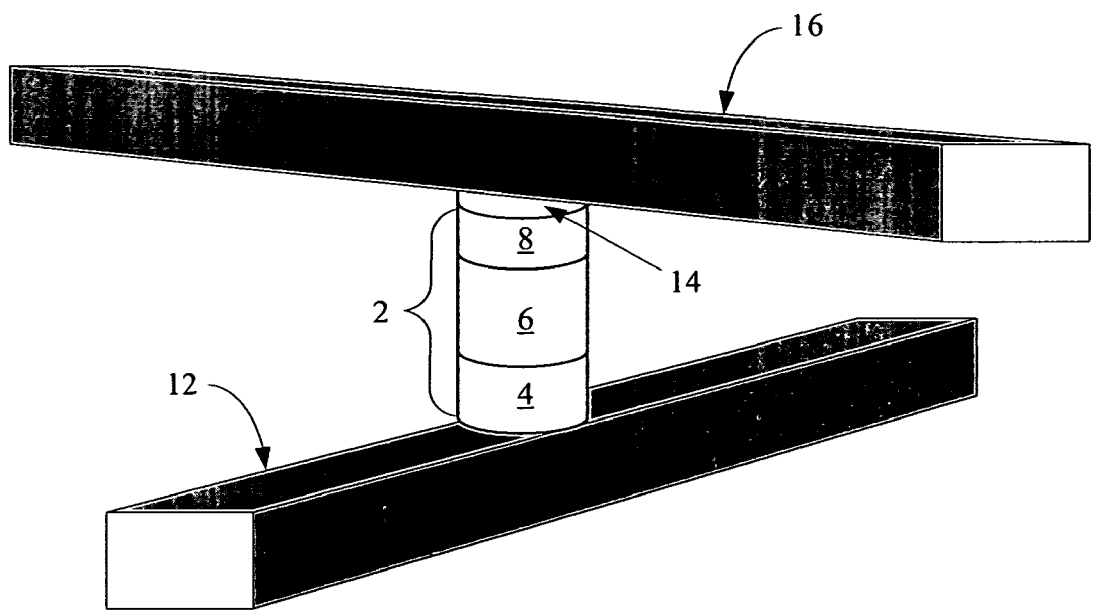
FIG. 1 is a perspective view of a nonvolatile memory cell comprising a diode and an antifuse according to U.S. Pat. No. 6,952,030.

FIG. 1 shows an embodiment of a nonvolatile memory cell like the one described in Herner et al., U.S. Pat. No. 6,952, 030, "High-Density Three-Dimensional Memory Cell," assigned to the assignee of the present invention, hereby incorporated by reference in its entirety and hereinafter referred to as the '030 patent. A bottom conductor 12 is formed of a conductive material, for example tungsten, and extends in a first direction. Barrier and adhesion layers may be included in bottom conductor 12. Polycrystalline semiconductor diode 2 is a p-i-n diode having a bottom heavily doped n-type region 4; an intrinsic region 6, which is not intentionally doped; and a top heavily doped region 8. Dielectric rupture antifuse 14 is disposed between diode 2 and top conductor 16. Top conductor 16 may be formed in the same manner and of the same materials as bottom conductor 12, and extends in a second direction different from the first direction, preferably perpendicular to it. Polycrystalline semiconductor diode 2 is vertically disposed between bottom conductor 12 and top conductor 16. An array of such memory cells can be formed above a substrate, for example above a monocrystalline silicon wafer.

A silicon wafer is essentially a single silicon crystal, with no grain boundaries between crystals. Grain boundaries impede current flow and make for a slower device. For this reason, in conventional semiconductor memory devices, memory arrays are formed with at least a portion of the monocrystalline wafer substrate included as part of each memory cell. In arrays in which memory cells comprise transistors, for example, the channel region of the transistor is typically formed in the wafer substrate.

Figure 2:
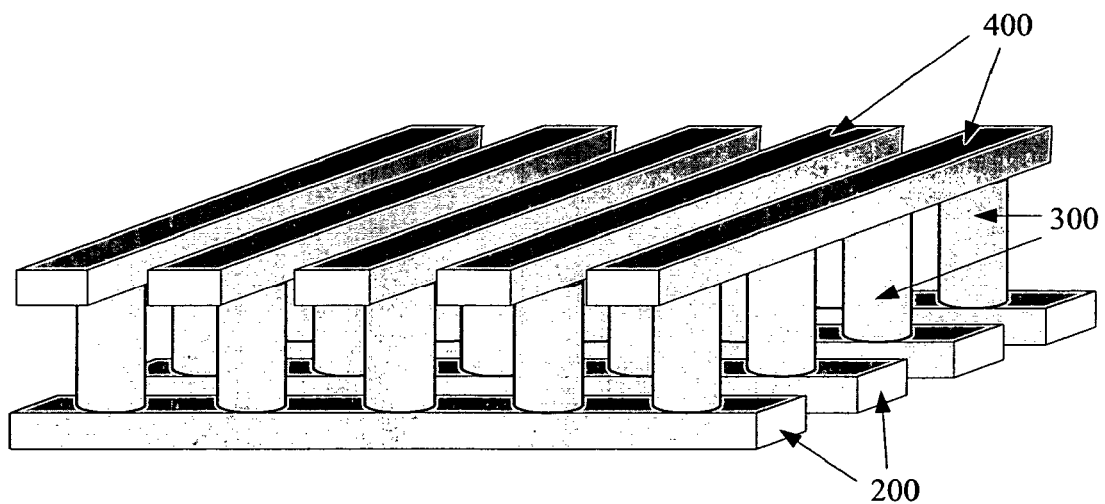
FIG. 2 is a perspective view of a memory level comprising memory cells like those of FIG. 1.

The array of the '030 patent is unusual in that the entire memory cell is formed above the substrate, in deposited layers. When a semiconductor material such as silicon is deposited, the resulting semiconductor layer is typically amorphous or polycrystalline. Referring to FIG. 1, in the array of the '030 patent, diode 2 is polycrystalline. Multiple memory levels of cells such as those shown in FIG. 1 can be formed stacked above a single substrate, forming a highly dense memory array. FIG. 2 shows a portion of a single memory level comprising bottom conductors 200, pillars 300 (each pillar comprising a diode and an antifuse), and top conductors 400.

A memory cell like that shown in FIG. 1 can operate in more than one way. In one mode of operation, when the cell is initially formed, when a read voltage is applied between conductors 12 and 16, dielectric rupture antifuse 14 prevents current flow between the conductors. When a higher voltage, a programming voltage, is applied between conductors 12 and 16, dielectric rupture antifuse 14 suffers irreversible dielectric breakdown and a conductive path through it is formed. After rupture of dielectric rupture antifuse 14, when a read voltage is applied between conductors 12 and 16, a discernible current flows between the conductors. The difference in current flow allows a programmed cell to be distinguished from an unprogrammed cell. In a memory cell operating this way, the data state (such as "0" or "1") is stored in the state of the antifuse (intact or ruptured.)

Figure 3:
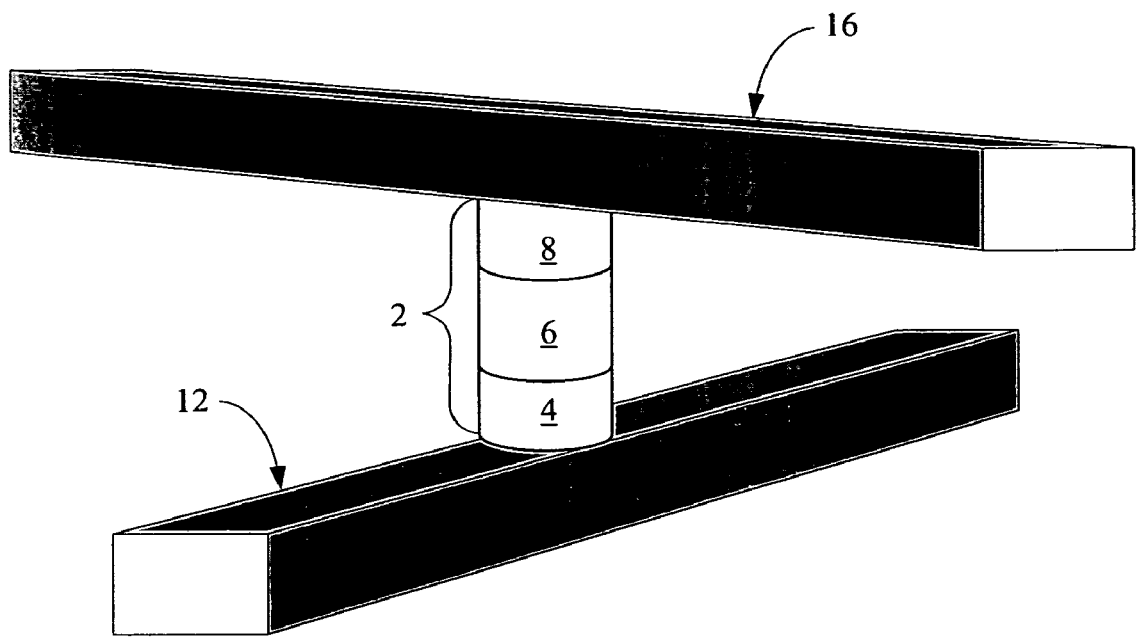
FIG. 3 is a perspective view of a nonvolatile memory cell having no antifuse.

The memory cell shown in FIG. 3 operates differently. In this memory cell dielectric rupture antifuse 14 has been omitted. Such a memory cell is described in detail in Herner et al., U.S. patent application Ser. No. 10/955,549, "Nonvolatile Memory Cell Without a Dielectric Antifuse Having High- and Low-Impedance States," filed Sep. 29, 2004; and in Herner et al., U.S. patent application Ser. No. 11/148,530, "Nonvolatile Memory Cell Operating by Increasing Order in Polycrystalline Semiconductor Material," filed Jun. 8, 2005 and hereinafter referred to as the '530 application, both hereby incorporated by reference. In this memory cell, the polycrystalline semiconductor material making up diode 2 includes grain boundaries and a certain degree of crystal defects, including twins, dislocations, etc. (Diode 2 may be formed of any polycrystalline semiconductor material, but for simplicity this discussion will assume the material is polycrystalline silicon. In this discussion polycrystalline silicon will be referred to as polysilicon.) These grain boundaries and defects serve to increase the resistivity of the polysilicon. The polysilicon that forms diode 2 is thus formed in a relatively high-resistance state. As in the mode of operation of the cell of FIG. 1, when the cell is formed, little or no current flows when a read voltage is applied between conductors 12 and 16.

Upon application of a higher programming voltage between the conductors, however, the polysilicon of the diode is changed, becoming more conductive. The change is believed to be caused by increasing the degree of order of crystallinity of the semiconductor material, as described in detail in the '530 application. After programming, when diode 2 is positively biased by applying voltage between conductors 12 and 16, diode 2 allows significantly larger current flow than before programming. The difference in current flow allows a programmed cell to be distinguished from an unprogrammed cell. In a memory cell operating this way, the data state ("0" or "1") is stored in the degree of order of the polysilicon making up diode 2.

In some embodiments, these methods of operation may be combined, such that application of a programming voltage ruptures a dielectric rupture antifuse and increases the order of polysilicon.

In other embodiments, however, it may be advantageous for the data state of the memory cell to be stored, as much as possible, in the state of the dielectric rupture antifuse. Such an embodiment may be easier to control and may maximize uniformity between memory cells. In this case it is advantageous to minimize the defect density and the occurrence of grain boundaries in the semiconductor material of diode 2 in the cell of FIG. 1.

Various methods are known to increase the size of crystals in deposited silicon. Such methods are most often used in formation of transistors having channel regions formed in a deposited silicon layer. One method is low-temperature, slow anneal of amorphous silicon, also called solid phase crystallization (SPC). The long anneal time required by SPC decreases throughput and thus limits the usefulness of this method. Metal-induced crystallization has also been effective, but may leave metal contamination in the crystallized film.

Another known method to increase grain size is laser annealing. Laser annealing works by locally and rapidly melting and recrystallizing deposited silicon.

In general, those skilled in the art would expect laser annealing to be inappropriate for use in formation of the device of FIG. 1. Recall that diode 2 comprises a bottom heavily doped region 4 and an undoped or lightly doped region 6. Heavily doped region 4 is doped by in situ doping or ion implantation, then undoped or lightly doped region 6 is formed on top of it. This steep dopant profile is crucial to device performance and must be maintained.

Diffusivity of dopants in molten silicon is extremely high. Those skilled in the art would expect that laser annealing of undoped or lightly doped region 6 and heavily doped region 4 would cause the dopant of heavily doped region 4 to diffuse into undoped or lightly doped region 6, erasing the desired dopant profile and ruining the device. Using conventional laser annealing methods, it is impractical to anneal these two regions in separate steps; when undoped or lightly doped region 6 is undergoing laser anneal, there is no way to stop the anneal at the boundary of regions 4 and 6.

In the present invention, however, a method of laser annealing has been identified which will crystallize such a structure while maintaining the original dopant profile nearly undisturbed.

In embodiments of the present invention, an amorphous layer of undoped or intrinsic semiconductor material formed above an amorphous layer of heavily doped semiconductor material is laser annealed. The semiconductor material is silicon or a silicon alloy which is silicon-rich, preferably at least 80 atomic percent silicon. The wavelength of the laser energy is between about 300 and about 600 nm, preferably between about 500 and 600 nm, most preferably between about 520 and about 540 nm, for example about 532 nm. The laser is preferably pulsed rather than continuous. In preferred embodiments, the heavily doped layer is formed in thermal contact with a thermally conductive layer or structure beneath it.

Different wavelengths of laser energy have different transmission behaviors in silicon. Silicon (or other materials) may either transmit or absorb such energy in varying degrees. Relatively long wavelength laser energy, such as red and infrared, having a wavelength in the range of 700-880 nm, are not readily absorbed by either crystalline or amorphous silicon. When annealed with an infrared or red laser, then, the energy is largely transmitted through the layer to be annealed, and may damage layers beneath. The memory levels of the '030 patent, for example, are formed over control circuitry in the form of CMOS in the wafer substrate. This CMOS may be damaged during such an anneal.

In contrast, short wavelength laser energy, such as ultraviolet and violet (with wavelength ranging from about 248 to about 400 nm) are strongly absorbed by both crystalline and amorphous silicon.

Intermediate wavelengths have different characteristics. Laser energy having a wavelength between about 520 and about 540 nm, for example about 532 nm, tends to be absorbed by amorphous silicon and transmitted by crystalline silicon. This behavior proves advantageous for crystallization of a structure having a doped region buried beneath an intrinsic region.

Figure 4A:
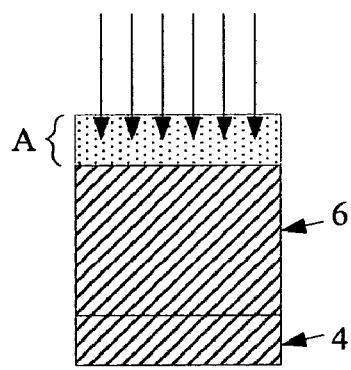
FIGS. 4a through 4d are cross-sectional views showing progressive crystallization of semiconductor layers according to an embodiment of the present invention.

Turning to FIG. 4a, suppose a silicon stack comprises heavily doped region 4 and intrinsic region 6, both of amorphous silicon. In FIGS. 4a-4d, amorphous silicon is indicated by cross-hatching. In this example heavily doped region 4 is doped with an n-type dopant. Alternatively a p-type dopant could be used. Pulsed laser energy having a wavelength of 532 nm is directed at the silicon stack from above. At this point the entire stack is amorphous.

Amorphous silicon absorbs laser energy at this wavelength, so initially laser energy is absorbed at the top of the silicon stack. This topmost section A of intrinsic region 6 absorbs the laser energy and is crystallized.

Figure 4B:
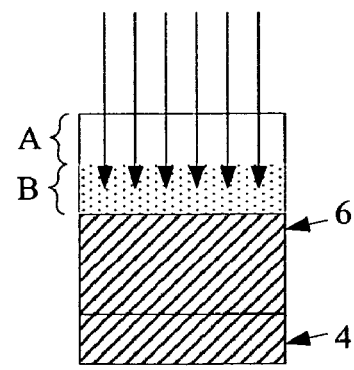
Figure 4C:
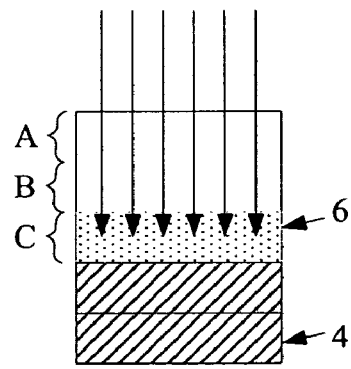

In FIG. 4b, the topmost section A of intrinsic region 6 has been crystallized, and the remainder of the stack is amorphous. Crystalline silicon transmits rather than absorbs laser energy at 532 nm, so when laser energy at this wavelength reaches the silicon stack, it is transmitted through topmost crystalline section A, and is absorbed by next section B, which is still amorphous, causing it to become crystalline. Similarly, in FIG. 4c, section B has been crystallized and now transmits laser energy, which is absorbed once it reaches section C, which is still amorphous. At this wavelength the laser energy is preferentially absorbed in a progressive front that moves downward through intrinsic region 6 as it crystallizes.

In contrast, if the laser energy were in the infrared range (about 880 nm), the laser energy would tend to penetrate through the silicon stack without much absorption, damaging the substrate. If the laser energy were ultraviolet (about 248 nm), the topmost regions would absorb this laser energy regardless of whether the silicon was crystalline or amorphous.

Figure 4D:
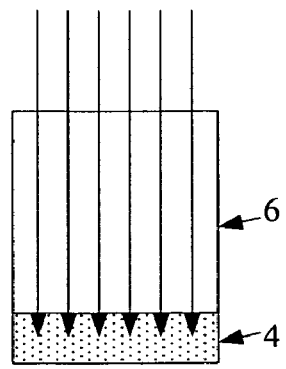

Turning to FIG. 4d, then, by the time the absorption front reaches heavily doped region 4, intrinsic region 6 above it is largely crystallized. Diffusion of dopant from heavily doped region 4 to intrinsic region 6 is minimized.

It is most common for laser annealing to be performed with a continuous laser. In the present invention, a pulsed laser is preferred. It is believed that the melting and cooling cycles resulting from a pulsed laser progressively generate a thermal gradient, melt silicon, create nuclei, and grow the nuclei into larger grains during successive pulses, while a continuous beam simply melts the silicon without controlling nucleation and grain growth. Continuous waves tend to damage the substrate while a pulsed beam limits damage to the substrate.

As will be described, when the methods of the present invention are used to form memory cells like the one pictured in FIG. 1, a silicon stack is formed on and in thermal contact with bottom conductors 12, and in most embodiments with a continuous conductive barrier layer. Thermally conductive material underneath heavily doped region 4 serves to rapidly dissipate heat, limiting unwanted dopant diffusion.

In preferred embodiments of the invention, then, an amorphous silicon stack comprising a doped layer buried beneath an undoped layer exposed to pulsed laser energy at a wavelength which is preferentially absorbed by amorphous silicon and transmitted by crystalline silicon. The amorphous silicon stack is preferably formed above and in thermal contact with a conductive structure or structures.

Many variations can be imagined. The silicon stack need not be fully amorphous; it may be microcrystalline or polycrystalline. The stack need not be pure silicon, but may be a silicon alloy instead, such as a silicon-germanium alloy. Preferably the alloy is at least 80 atomic percent silicon.

In preferred embodiments, the heavily doped bottom layer has a dopant concentration greater than about $1 \times 10^{19}$ atoms/cm$^3$. The heavily doped layer has a first thickness before the anneal, and a second thickness after the anneal. If the dopant has diffused, the thickness of the layer having a dopant concentration greater than $1 \times 10^{19}$ atoms/cm$^3$ will increase as the boundary between the doped and undoped layers moves upward. The methods of the present invention will decrease or prevent an increase in the thickness of the heavily doped layer. In preferred embodiments, dopant diffusion is minimized such that the second thickness (after anneal) is no more than 300 angstroms more than the first thickness (before anneal.)

A detailed example will be provided describing formation of a monolithic three dimensional memory array in which each memory level comprises vertically oriented semiconductor junction diodes, the diodes crystallized by laser annealing according to embodiments of the present invention. The term junction diode is used herein to refer to a semiconductor device with the property of non-ohmic conduction, having two terminal electrodes, and made of semiconducting material which is ptype at one electrode and n-type at the other. Additional information regarding formation of a similar memory array may be found in the '030 patent as well as in Herner et al., U.S. patent application Ser. No. 11/125,606, "High-Density Nonvolatile Memory Array Fabricated at Low Temperature Comprising Semiconductor Diodes," filed May 9, 2005, hereinafter referred to as the '606 application and hereby incorporated by reference. To avoid obscuring the invention, not all details from this patent and application will be included, but it will be understood that no teaching of the '030 patent, the '606 application, or any other incorporated patents or applications is intended to be excluded.

For clarity, in this explanation many specific steps and details will be provided; it will be understood by those skilled in the art that this example is for illustration only, is intended to be non-limiting, and that many of these steps and details may be altered, augmented, or omitted while the results fall within the scope of the invention.

EXAMPLE

Fabrication of a single memory level will be described in detail. Additional memory levels can be stacked, each monolithically formed above the one below it.

Figure 5A:
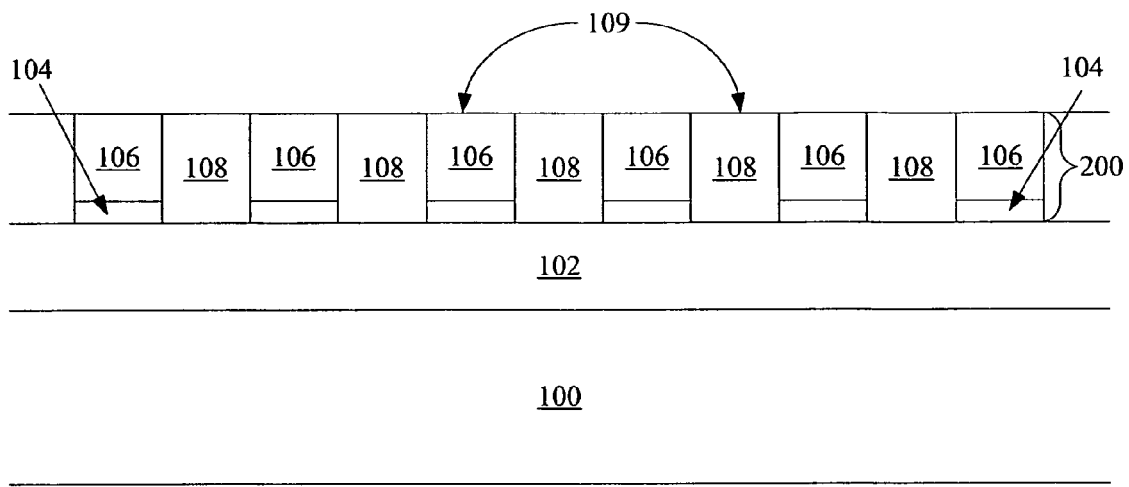

Turning to FIG. 5a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. If the overlying conducting layer is tungsten, titanium nitride is preferred as adhesion layer 104.

The next layer to be deposited is conducting layer 106. Conducting layer 106 can comprise any conducting material known in the art, such as tungsten, aluminum, or any other appropriate conductive material, including metal, a metal alloy, or conductive nitride. Note that if the polysilicon of the diodes to be formed in a subsequent step were crystallized by a thermal anneal at conventional temperatures, instead of the laser anneal to be described, this thermal anneal would require a temperature incompatible with the use of aluminum, which softens and extrudes above about 475 degrees C. It is expected that use of the methods of the present invention to crystallize the diodes will enable use of aluminum or other materials that cannot tolerate high temperature in conducting layer 106. If conducting layer 106 is aluminum, a layer of titanium nitride (not shown) may be formed on conducting layer 106 to enable a coming planarization step, as described in Dunton et al., U.S. patent application Ser. No. 11/237,169, "Method to Minimize Formation of Recess at Surface Planarized by Chemical Mechanical Planarization," filed Sep. 28, 2005, hereby incorporated by reference.

Once all the layers that will form the conductor rails have been deposited, the layers will be patterned and etched using any suitable masking and etching process to form substantially parallel, substantially coplanar conductors 200, shown in FIG. 5a in cross-section extending out of the page. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 5a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 5B:
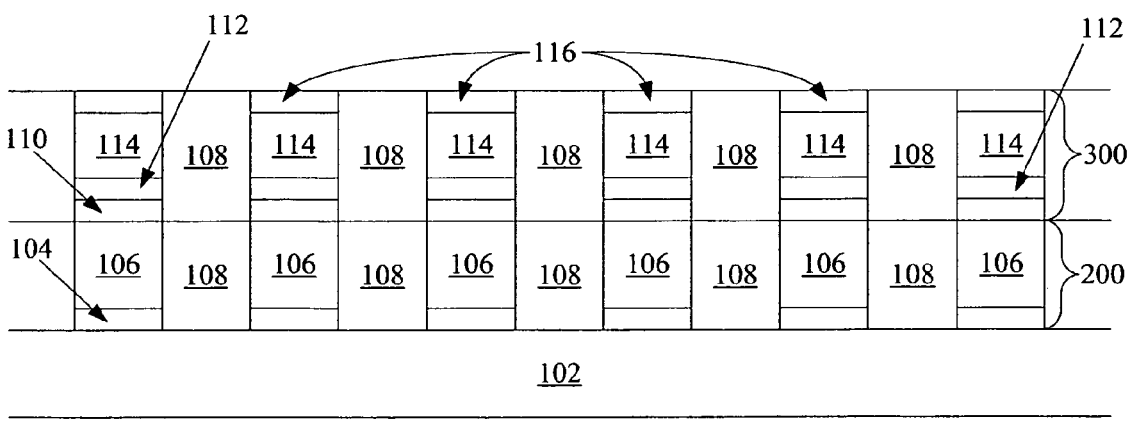

Next, turning to FIG. 5b, vertical pillars 300 will be formed above completed conductor rails 200. (To save space substrate 100 is not shown in FIG. 5b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer 104 described earlier.

Next semiconductor material that will be patterned into pillars is deposited. The semiconductor material can be silicon or a silicon alloy which is preferably at least 80 atomic percent silicon. For simplicity, this description will refer to the semiconductor material as silicon, but it will be understood that the skilled practitioner may select other suitable alloys.

In preferred embodiments, the pillar comprises a semiconductor junction diode. Turning to FIG. 6a, a preferred junction diode has a bottom heavily doped region 112, intrinsic region 114, and top heavily doped region 116. The conductivity type of bottom region 112 and top region 116 are opposite: Either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped. Intrinsic region 114 may be undoped, or, in some embodiments, may be lightly doped, and preferably has a dopant concentration less than about $5 \times 10^{18}$ atoms/cm$^3$.

In FIG. 6a, and in the exemplary array, bottom region 112 will be n-type while top region 116 is p-type. It will be understood that these conductivity types could be reversed, as in FIG. 6b.

To form the diode of FIG. 6a, returning to FIG. 5b, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon.

Heavily doped region 112 is preferably between about 100 and about 800 angstroms thick, most preferably about 200 angstroms thick.

Undoped silicon is to be deposited next to form intrinsic layer 114. Intrinsic layer 114 can be formed by any method known in the art. The combined thickness of heavily doped layer 112 and intrinsic layer 114 is preferably between about 1000 and about 4300 angstroms, preferably between about 2000 and about 4000 angstroms.

Following deposition of intrinsic layer 114, this layer and heavily doped layer 112 are preferably amorphous. The wafer is removed from the chamber and is exposed to laser energy.

The wavelength of laser energy is between about 300 and about 600 nm, preferably between about 500 and about 600 nm, more preferably between about 520 and about 540 nm. The wavelength is most preferably about 532 nm. The laser is pulsed rather than continuous. An advantageous pulse frequency is between about 30 and about 50 kHz, preferably between about 40 and 45 kHz. The laser duration (the "on" time of the laser during each pulse) is kept short, preferably between about 20 and about 80 ns, most preferably between about 40 and about 45 ns. In preferred embodiments the "on" time of the laser is much shorter than the "off" time. Note that the presence of conductive barrier layer 110 and conductors 200 beneath semiconductor layers 112 and 114 serves to rapidly dissipate heat, which is believed to be advantageous.

The velocity of the laser can be as desired for throughput. Velocities of, for example, 23.20, 14.48, and 11.60 mm/sec proved advantageous in various trials. Pulses per site may also be varied; for example 10, 15 and 20 pulses per site proved advantageous. For 20 pulses, the energy density of the laser was 700 mJ/cm$^2$. The beam width is preferably on the order of microns in width, and millimeters to centimeters in length.

For example, the beam width may be 6 microns wide and 2 mm long. The time required to get 20 pulses at a site with a frequency of 45 kHz is 0.5 milliseconds. In order to travel 6 microns in 0.5 milliseconds, a scan speed of 12 mm/sec is required. Using these laser parameters, a standard wafer having a diameter of 200 mm can be fully scanned in about 22 minutes.

Those skilled in the art will appreciate that the frequency, pulse duration, energy density, and laser velocity are interrelated; thus as pulse duration is increased, for example, number of pulses per site may be decreased. Further, these variables will need to be adjusted depending on the thickness of the silicon stack to be annealed, the germanium content of a silicon-germanium alloy, etc. It is routine to identify optimum conditions for anneal depending on the characteristics of the layer to be annealed. After the laser anneal is complete, semiconductor layers 112 and 114 will likely be polycrystalline with large grain sizes, for example between about 0.5 to 1.0 micron, though larger or smaller grain sizes may be achieved.

Returning to FIG. 5b, semiconductor layers 114 and 112, which were just annealed, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728436, "Photomask Features with Interior Nonprinting Window Using Alternating Phase Shifting," filed Dec. 5, 2003; or Chen, U.S. application Ser. No. 10/815312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BF_2$. The resulting structure is shown in FIG. 5b.

In this example the laser anneal was performed on the silicon layers 112 and 114 before patterning into pillars. This is advantageous because the continuous silicon layer absorbs laser energy, preventing or minimizing damage to CMOS in the underlying substrate. In less preferred embodiments, the laser anneal could be performed at this point, after patterning.

In preferred embodiments, the patterned dimension (width, or dimension in a plane perpendicular to the substrate) of pillars 300 is less than about 150 nm, for example about 130 nm or about 90 or 65 nm. It will be recalled that after the laser anneal, grain sizes of about 0.5 to 1.0 micron, or about 500 to 1000 nm, were achieved. The preferred height of a pillar (after loss of several hundred angstroms during CMP) is between about 1000 and about 3500 angstroms, or 100 and 350 nm. It will be seen, then, that after patterning any pillar 300 is likely to have no grain boundaries, and very unlikely to have more than one.

In less preferred embodiments, heavily doped p-type region 116 could have been formed by in situ doping.

Turning to FIG. 5c, the next element to be formed is dielectric rupture antifuse 118. This layer can be deposited, and may be any appropriate dielectric material. For example, a layer of $Al_2O_3$ can be deposited at about 150 degrees C. Other materials may be used instead. Dielectric rupture antifuse 118 is preferably between about 20 and about 80 angstroms thick, preferably about 50 angstroms thick. In alternative embodiments, dielectric rupture antifuse 118 may be grown by thermal oxidation of a portion of heavily doped p-type region 116 rather than being deposited. The temperature required for thermal oxidation may be higher than desirable, however.

Top conductors 400 can be formed in the same manner as bottom conductors 200, for example by depositing adhesion layer 120, preferably of titanium nitride, and conductive layer 122, preferably of tungsten or aluminum. Conductive layer 122 and adhesion layer 120 are then patterned and etched using any suitable masking and etching technique to form substantially parallel, substantially coplanar conductors 400, shown in FIG. 5c extending left-to-right across the page. Each pillar 300 should be disposed between a bottom conductor 200 and a top conductor 400. Some misalignment can be tolerated. Top conductors 400 preferably extend substantially perpendicular to bottom conductors 200: In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Summarizing, a memory cell has been formed by forming a bottom conductor; depositing an amorphous, microcrystalline, or polycrystalline semiconductor layer above the bottom conductor, the semiconductor layer comprising a bottom heavily doped region and a middle lightly doped or undoped region; crystallizing the semiconductor layer by illuminating the semiconductor layer with laser energy; and forming a top conductor above the semiconductor layer, wherein the memory cell comprises a portion of the bottom conductor, the semiconductor layer, and a portion of the top conductor, wherein the semiconductor layer further comprises a top heavily doped region, and wherein, after formation of the memory cell is complete, the semiconductor layer has a thickness no more than about 3500 angstroms and the middle lightly doped or undoped region has a thickness no less than about 1000 angstroms. In some embodiments, the thickness of the middle lightly doped or undoped region is no more than about 1500 angstroms, while in some embodiments, the thickness of the semiconductor layer is no more than about 3000 angstroms.

Formation of a first memory level has been described. Additional memory levels can be formed above this first memory level. In some embodiments, conductors can be shared between memory levels; i.e. top conductor 400 would serve as the bottom conductor of the next memory level. In other embodiments, an interlevel dielectric (not shown) is formed above the first memory level of FIG. 5*c*, its surface planarized, and construction of a second memory level begins on this planarized interlevel dielectric, with no shared conductors.

This monolithic three dimensional memory array has been formed by forming a first plurality of substantially parallel, substantially coplanar conductors; forming a first heavily doped polycrystalline semiconductor layer above the first conductors; forming a second lightly doped or undoped polycrystalline semiconductor layer on the first heavily doped polycrystalline semiconductor layer; laser annealing the first and second semiconductor layers; patterning and etching the first and second semiconductor layers to form first pillars; forming a top heavily doped region in each first pillar wherein each pillar comprises a vertically oriented p-i-n diode; and forming a second plurality of substantially parallel, substantially coplanar conductors above the first pillars, wherein, after formation of the first memory level, each vertically oriented p-i-n diode comprises a lightly doped or undoped region having a thickness of at least 1000 angstroms.

A monolithic three dimensional memory array is one in which multiple memory levels are formed above a single substrate, such as a wafer, with no intervening k substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The present invention has been described in anneal of semiconductor layers which are patterned to form a vertically oriented p-i-n diode. The diode is a portion of a memory cell in a monolithic three dimensional memory array. Those skilled in the art, however, will appreciate that the methods of the present invention could advantageously be used in any appropriate structure, specifically in which a heavily doped silicon layer is buried beneath an undoped or lightly doped silicon layer, both layers are amorphous, microcrystalline, or polycrystalline, and it is desired that grain size be maximized.

As described, use of the laser annealing methods describe herein is particularly useful in monolithic three dimensional structures because these methods decrease the thermal stresses to which each successive memory level is subjected. As will be apparent to those skilled in the art, however, utility of laser anneal of deposited silicon or silicon-rich alloys is in no way limited to monolithic three dimensional structures, and can be useful wherever there is a need to limit dopant diffusion in deposited layers.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for laser annealing to crystallize a semiconductor layer, the method comprising:

depositing a semiconductor layer comprising polycrystalline, microcrystalline, or amorphous semiconductor material, the semiconductor layer having a lower region and an upper region adjacent the lower region, wherein the lower region is heavily doped and the upper region is undoped or lightly doped; and crystallizing the semiconductor layer by illuminating the semiconductor layer from above with laser energy, wherein the semiconductor layer crystallizes progressively downward through the upper region and the lower region, such that the upper region crystallizes before the lower region melts, so as to substantially maintain a semiconductor layer dopant profile.

2. The method of claim 1, wherein:

before the crystallizing step, the lower region has a first lower thickness having a first dopant concentration of at least $1 \times 10^{19}$ dopant atoms/cm$^3$, the upper region has a first upper thickness, and the lower region and the upper region form a first dopant profile;

after the crystallizing step, the lower region has a second lower thickness having a second dopant concentration of at least $1 \times 10^{19}$ dopant atoms/cm$^3$, the upper region has a second upper thickness, and the lower region and the upper region form a second dopant profile; and the second lower thickness is no more than 300 angstroms more than the first lower thickness, the second upper thickness is greater than zero and no more than 300 angstroms less than the first upper thickness, and the second dopant profile is similar to the first dopant profile.

3. The method of claim 1 wherein the semiconductor layer is at least 80 atomic percent silicon, and the wavelength of the laser energy is between about 520 and 540 nm.

4. The method of claim 1 wherein the laser energy is pulsed, the semiconductor layer comprises at least one feature site, and each site receives between about 11 and 20 pulses.

5. The method of claim 1 wherein the laser energy is pulsed, and pulse duration of the laser energy is between about 20 and 80 nanoseconds.

6. The method of claim 1 wherein the laser energy is pulsed at a frequency of between about 30 kHz and 50 kHz.

7. The method of claim 1 wherein the semiconductor layer comprises a feature site, the laser energy is a pulsed beam, and the beam has a scan speed of between about 11 mm/sec and 24 mm/sec across the feature site.

8. A method for forming a vertical semiconductor structure, the method comprising:
    forming, in an amorphous semiconductor material, a vertical structure having a lower region of a first conductivity type and an upper region overlying the lower region, wherein the lower region is heavily doped and the upper region is undoped or lightly doped;
    annealing the vertical structure from above using pulsed laser energy selectively absorbed by the amorphous semiconductor material and selectively transmitted by crystals of the semiconductor material, wherein the vertical structure crystallizes progressively downward through the upper region and the lower region, such that the upper region crystallizes before the lower region melts, so as to reduce upward dopant diffusion from the lower region to the upper region.

9. The method of claim 8, further comprising:
    forming, in an upper portion of the crystallized upper region of the vertical structure, a second heavily doped region of a second conductivity type, wherein the second conductivity type differs from the first conductivity type.

10. The method of claim 8, further comprising:
    forming a bottom conductor comprising a conductive material that softens or extrudes at or above 475 degrees Celsius, the amorphous semiconductor material formed above the bottom conductor.

11. A method for laser annealing to crystallize a semiconductor layer, the method comprising:
    depositing a polycrystalline, microcrystalline, or amorphous semiconductor layer having a lower heavily doped region and an adjacent upper undoped or lightly doped region; and
    after depositing the upper undoped or lightly doped region, crystallizing the lower heavily doped region and the upper undoped or lightly doped region by illuminating the semiconductor layer with laser energy, wherein
    before the crystallizing step, the lower heavily doped region has a first thickness in which dopant concentration is at least $1\times10^{19}$ dopant atoms/cm$^3$;
    during the crystallizing step, the semiconductor layer crystallizes progressively downward through the upper undoped or lightly doped region and the lower heavily doped region, such that the upper undoped or lightly doped region crystallizes before the lower heavily doped region melts, so as to reduce diffusion of dopant atoms from the lower heavily doped region to the upper undoped or lightly doped region; and
    after the crystallizing step, the lower heavily doped region has a second thickness in which dopant concentration is at least $1\times10^{19}$ dopant atoms/cm$^3$, wherein the second thickness is no more than 300 angstroms more than the first thickness.

12. The method of claim 11 wherein the laser energy has a wavelength selectively absorbed more by an amorphous structure of the semiconductor layer than by a crystalline structure of the semiconductor layer.

13. The method of claim 12 wherein the laser energy selectively absorbed more by the amorphous structure causes the amorphous structure to melt, and wherein the laser energy does not cause the crystalline structure to melt.

14. The method of claim 13 wherein the semiconductor layer is at least 80 atomic percent silicon and the wavelength of the laser energy is between about 500 and about 600 nm.

15. The method of claim 14 wherein the wavelength of the laser energy is between about 520 and 540 nm.

16. The method of claim 15 wherein the wavelength of the laser energy is about 532 nm.

17. The method of claim 11 wherein the laser energy is pulsed, the semiconductor layer comprises at least one site, and between about 11 and 20 pulses are used per site.

18. The method of claim 7 wherein pulse duration of the laser energy is between about 20 and 80 nanoseconds.

19. The method of claim 11 wherein the laser energy is pulsed at a frequency of between about 30 kHz and 50 kHz.

20. The method of claim 11 wherein the semiconductor layer forms a portion of a memory cell comprising a bottom conductor, the semiconductor layer formed above the bottom conductor.

* * * * *

UNITED STATES PATENT AND TRADEMARK OFFICE
CERTIFICATE OF CORRECTION

PATENT NO. : 7,615,502 B2
APPLICATION NO. : 11/303229
DATED : November 10, 2009
INVENTOR(S) : Shuo Gu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 149 days.

Signed and Sealed this

Nineteenth Day of October, 2010

David J. Kappos
*Director of the United States Patent and Trademark Office*